(12) United States Patent
Yang et al.

(10) Patent No.: US 8,607,123 B2
(45) Date of Patent: Dec. 10, 2013

(54) CONTROL CIRCUIT CAPABLE OF IDENTIFYING ERROR DATA IN FLASH MEMORY AND STORAGE SYSTEM AND METHOD THEREOF

(75) Inventors: Jiunn-Yeong Yang, Keelung (TW); Chih-Kang Yeh, Kinmen County (TW)

(73) Assignee: Phison Electronics Corp., Miaoli (TW)

(*) Notice: Subject to any disclaimer, the term of this patent is extended or adjusted under 35 U.S.C. 154(b) by 706 days.

(21) Appl. No.: 12/542,130

(22) Filed: Aug. 17, 2009

(65) Prior Publication Data
US 2010/0325524 A1    Dec. 23, 2010

(30) Foreign Application Priority Data

Jun. 23, 2009   (TW) .............................. 98121002 A

(51) Int. Cl.
*G11C 29/00* (2006.01)
(52) U.S. Cl.
USPC ........................... 714/773; 714/6.11; 714/710
(58) Field of Classification Search
USPC ................. 714/6.11, 6.13, 710, 773
See application file for complete search history.

(56) References Cited

U.S. PATENT DOCUMENTS

| | | | | |
|---|---|---|---|---|
| 6,247,152 | B1* | 6/2001 | Russell ........................ | 714/718 |
| 6,260,156 | B1* | 7/2001 | Garvin et al. ................ | 714/6.13 |
| 7,797,597 | B2* | 9/2010 | Roohparvar ................. | 714/723 |
| 8,051,339 | B2* | 11/2011 | Sung et al. ................... | 714/710 |
| 2001/0010085 | A1* | 7/2001 | Rafanello et al. ............ | 714/710 |
| 2003/0009708 | A1* | 1/2003 | Nishimura ........................ | 714/8 |
| 2006/0085670 | A1* | 4/2006 | Carver et al. ..................... | 714/5 |
| 2008/0294935 | A1* | 11/2008 | Ni et al. ............................ | 714/6 |
| 2010/0122148 | A1* | 5/2010 | Flynn et al. .................... | 714/773 |
| 2011/0296258 | A1* | 12/2011 | Schechter et al. ............ | 714/704 |
| 2012/0110419 | A1* | 5/2012 | Ni et al. ......................... | 714/773 |

FOREIGN PATENT DOCUMENTS

| | | |
|---|---|---|
| CN | 101124544 | 2/2008 |
| CN | 101399075 | 4/2009 |

OTHER PUBLICATIONS

"First Office Action of China counterpart application" issued on Aug. 21, 2012, p. 1-p. 8.

* cited by examiner

*Primary Examiner* — Joshua Lohn
(74) *Attorney, Agent, or Firm* — J.C. Patents

(57) ABSTRACT

A flash memory control circuit including a microprocessor unit, a first interface unit for connecting a flash memory, a second interface unit for connecting a computer host, an error correcting unit, a memory management unit, and a marking unit is provided. The memory management unit divides each page in the flash memory into a plurality of data bit areas, and a plurality of redundancy bit areas and a plurality of error correcting bit areas corresponding to the data bit areas, wherein each of the data bit areas has a plurality of sectors for respectively storing a sector data. The marking unit stores a data accuracy mark corresponding to each sector data in the corresponding redundancy bit area to record the status of the sector data. Thereby, the flash memory controller can effectively identify error data in the flash memory by using the error correcting codes and the data accuracy marks.

24 Claims, 9 Drawing Sheets

CONTROL CIRCUIT CAPABLE OF IDENTIFYING ERROR DATA IN FLASH MEMORY AND STORAGE SYSTEM AND METHOD THEREOF

CROSS-REFERENCE TO RELATED APPLICATION

This application claims the priority benefit of Taiwan application serial no. 98121002, filed on Jun. 23, 2009. The entirety of the above-mentioned patent application is hereby incorporated by reference herein and made a part of specification.

BACKGROUND

1. Technology Field

The present invention generally relates to a flash memory control circuit, and more particularly, to a flash memory controller capable of identifying error data in a flash memory, a flash memory storage system, and a method for identifying the error data in the flash memory.

2. Description of Related Art

Along with the widespread of digital cameras, cell phones, and MP3 in recently years, the consumers' demand to storage media has increased drastically. Flash memory is one of the most adaptable memories for such battery-powered portable products due to its characteristics such as data non-volatility, low power consumption, small volume, and non-mechanical structure. A solid state drive (SSD) is a storage device which uses a NAND flash memory as its storage medium.

An error correcting circuit is usually adopted in the design of a flash memory storage device for verifying whether data stored in the flash memory storage device is accurate. To be specific, if a computer host connected with the flash memory storage device transmits data to the flash memory storage device, the error correcting circuit in the flash memory storage device generates an error correcting code corresponding to the data, and a control circuit in the flash memory storage device writes the data and the error correcting code into a flash memory of the flash memory storage device. Subsequently, when the computer host is about to read the data from the flash memory storage device, the control circuit reads the data and the corresponding error correcting code from the flash memory, and the error correcting circuit executes an error correcting process according to the data and the corresponding error correcting code to ensure the accuracy of the data. If the data is accurate, the control circuit transmits the data to the computer host, and if the data contains error bits, the error correcting process executed by the error correcting circuit will try to correct the error. If the number of error bits is within a correctable range, the error bits are corrected and the control circuit transmits the corrected data to the computer host. Contrarily, if the number of error bits exceeds the correctable range, the control circuit notifies the computer host that the data is lost.

Generally speaking, the flash memory in a flash memory storage device has a plurality of physical blocks, and a flash memory controller of the flash memory storage device logically groups these physical blocks into a system area, a data area, a spare area, and a replacement area. To be specific, the physical blocks in the system area are used to store important information related to the flash memory storage device, and the physical blocks in the replacement area are used to replace damaged physical blocks in the data area or the spare area. Accordingly, a host system cannot access the physical blocks in the system area and the replacement area in a general access state. The physical blocks in the data area are used to store valid data written by write commands, and the physical blocks in the spare area are used to substitute the physical blocks in the data area when the write commands are executed. To be specific, when the flash memory storage device receives a write command from the host system and is about to update (or write data into) a physical block in the data area, the flash memory storage device selects a physical block from the spare area and writes both the old valid data in the physical block to be updated in the data area and the new data into the physical block selected from the spare area. After that, the flash memory storage device logically links the physical block containing the new data to the data area, erases the physical block to be updated in the data area and links it to the spare area. The flash memory storage device provides logical blocks to the host system in order to allow the host system to successfully access the physical blocks which are alternatively used for storing data. Namely, the flash memory storage device reflects the alternation of the physical blocks by recording and updating the mapping relationship between the logical blocks and the physical blocks in the data area in a logical address-physical address mapping table. Thereby, the host system simply writes data into the logical blocks while the flash memory storage device reads data from or writes data into the corresponding physical blocks according to the logical address-physical address mapping table.

According to the operation mechanism described above, when data is copied from one physical block to another physical block, the error correcting circuit always executes the error correcting process while reading data, re-generates the error correcting code according to the corrected data while writing data, and eventually writes the corrected data and the newly generated error correcting code into the other physical block. However, if error bits that cannot be corrected are found when the error correcting process is executed, because the error correcting code is re-generated according to the error data, when subsequently the data is read by the computer host, the error correcting circuit executes the error correcting process to the error data according to the re-generated error correcting code and accordingly determines the data to be accurate. In this case, the computer host will receive the error data, and in particular, the computer host will use this error data as an accurate data.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a flash memory controller which can effectively identify error data in a flash memory so that the error data is prevented from being transmitted to a computer host.

The present invention is directed to a flash memory storage system which can effectively identify error data in a flash memory thereof so that the error data is prevented from being transmitted to a computer host.

The present invention is further directed to an error data identifying method for effectively identifying error data in a flash memory.

According to an exemplary embodiment of the present invention, a flash memory control circuit including a microprocessor unit, a first interface unit, a second interface unit, an error correcting unit, a memory management unit, and a marking unit is provided. The first interface unit is coupled to the microprocessor unit and used to connect a flash memory, wherein the flash memory has a plurality of physical blocks, and each of the physical blocks has a plurality of pages. The second interface unit is coupled to the microprocessor unit and used to connect a computer host. The error correcting unit is coupled to the microprocessor unit. The memory management unit is coupled to the microprocessor unit and used to divide each of the pages into at least one data bit area, and at least one redundancy bit area and at least one error correcting bit area corresponding to the data bit area, wherein the data bit area has a plurality of sectors for respectively storing a sector data. The marking unit is coupled to the microprocessor unit. When the computer host writes a plurality of sector data into one of the data bit areas, the error correcting unit generates an error correcting code according to the sector data, the memory management unit writes the sector data into the data bit area and the error correcting code into the corresponding error correcting bit area, and the marking unit records data accuracy marks in the corresponding redundancy bit area as a normal status, wherein each of the data accuracy marks is corresponding to one sector data.

According to an exemplary embodiment of the present invention, a flash memory storage system is provided, wherein the flash memory storage system includes a connector which is used to connect a computer host, a flash memory, and a flash memory controller. The flash memory has a plurality of physical blocks, and each of the physical blocks has a plurality of pages. The flash memory controller is coupled to the connector and the flash memory, and used to divide each of the pages into at least one data bit area, and at least one redundancy bit area and at least one error correcting bit area corresponding to the data bit area, wherein the data bit area has a plurality of sectors for respectively storing a sector data. When the computer host writes a plurality of sector data into one of the data bit areas, the flash memory controller generates an error correcting code according to the sector data, writes the sector data into the data bit area, writes the error correcting code into the corresponding error correcting bit area, and records data accuracy marks in the corresponding redundancy bit area as a normal status, wherein each of the data accuracy marks is corresponding to one sector data.

According to an exemplary embodiment of the present invention, a method for identifying error data in a flash memory is provided. The present method includes providing the flash memory, wherein the flash memory has a plurality of physical blocks, and each of the physical blocks has a plurality of pages. The present method also includes dividing each of the pages into at least one data bit area, and at least one redundancy bit area and at least one error correcting bit area corresponding to the data bit area, wherein the data bit area has a plurality of sectors. The present method further includes disposing a plurality of data accuracy marks in each of the redundancy bit areas by using a marling unit. In the present method, when a computer host writes a plurality of sector data into one of the data bit areas, an error correcting code corresponding to the sector data is written into the corresponding error correcting bit area, and data accuracy marks are recorded in the corresponding redundancy bit area by using the marking unit as a normal status, wherein each of the data accuracy marks is corresponding to one sector data. In the present method, when sector data stored in one of the data bit areas is copied to another data bit area, whether the sector data to be copied contains an error bit that cannot be corrected is determined according to the corresponding error correcting code stored in the corresponding error correcting bit area, wherein if the sector data contains the uncorrectable error bit, the data accuracy marks are recorded in the corresponding redundancy bit area by using the marking unit as an error status.

According to an exemplary embodiment of the present invention, a method for identifying error data in a flash memory is provided. The present method includes providing the flash memory, wherein the flash memory has a plurality of physical blocks, and each of the physical blocks has a plurality of pages. The present method also includes dividing each of the pages into at least one data bit area, and at least one redundancy bit area and at least one error correcting bit area corresponding to the data bit area, wherein each of the data bit areas has a sector. The present method further includes configuring a data accuracy mark in each of the redundancy bit areas by using a marking unit. In the present method, when a computer host writes a plurality of sector data into one of the data bit areas, an error correcting code corresponding to the sector data is written into the corresponding error correcting bit area, and data accuracy marks are recorded in the corresponding redundancy bit area by using the marking unit as a normal status. In the present method, when sector data stored in one of the data bit areas is copied to another data bit area, whether the sector data to be copied contains an error bit that cannot be corrected is determined according to the corresponding error correcting code stored in the corresponding error correcting bit area, wherein if the sector data contains the uncorrectable error bit, the data accuracy marks are recorded in the corresponding redundancy bit area by using the marking unit as an error status.

As described above, in the present invention, error data in a flash memory can be effectively identified according to corresponding error correcting codes and data accuracy marks, so that the error data is prevented from being sent to a computer host.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
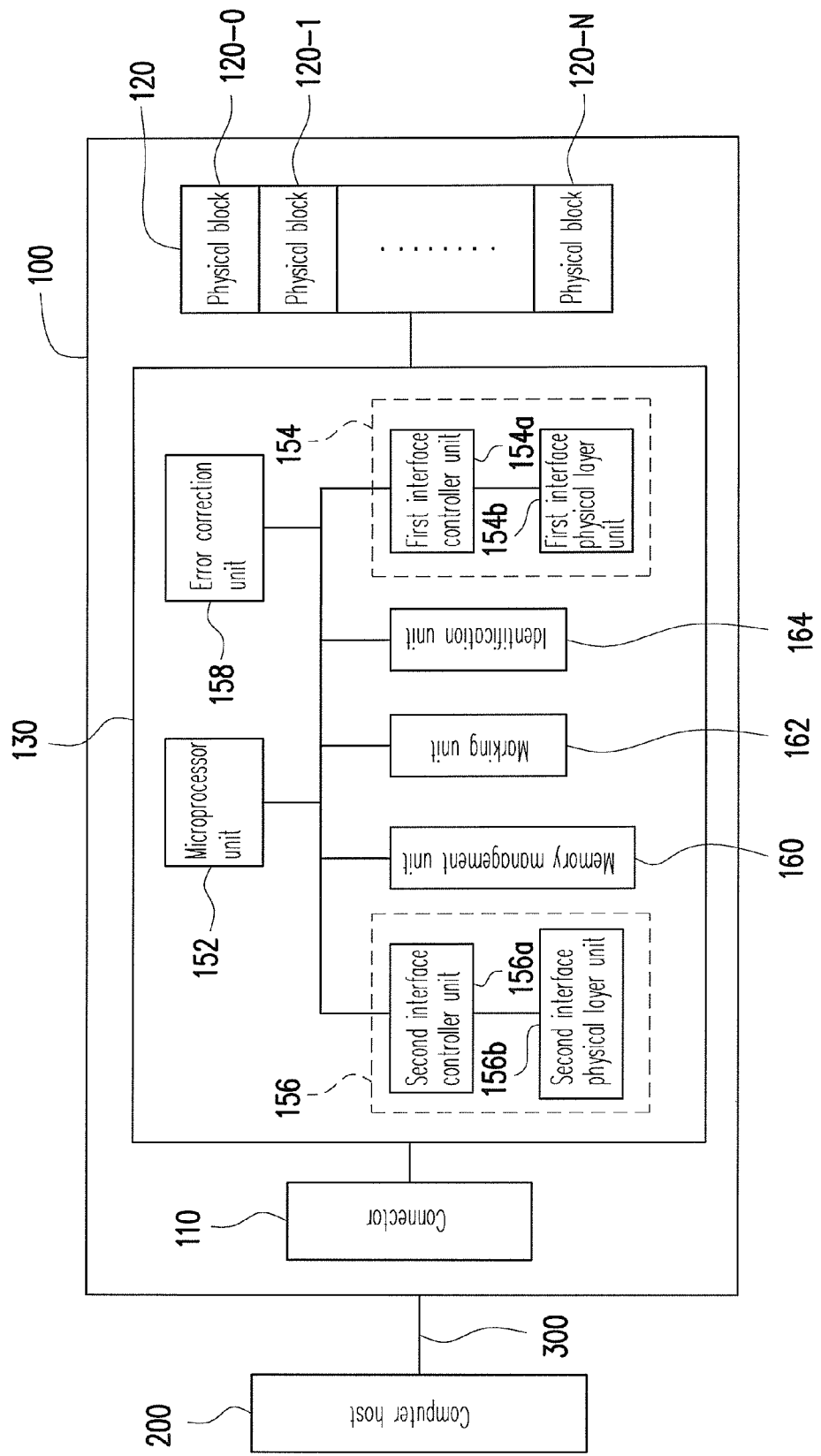
FIG. 1 is a schematic block diagram of a flash memory storage system according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

According to the present invention, data accuracy marks are recorded in a flash memory for identifying whether the data currently stored in the flash memory is accurate. In particular, the data accuracy marks are respectively corresponding to each sector data written by a computer host. Thus, whether each sector data is accurate can be determined according to the corresponding data accuracy mark. Herein, a sector data refers to data having a data length of 1 sector, and in existing computer systems, each sector has 512 bytes. Exemplary embodiments of the present invention will be described below with reference to accompanying drawings.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A,B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

FIG. 1 is a schematic block diagram of a flash memory storage system according to an exemplary embodiment of the present invention.

Referring to FIG. 1, the flash memory storage system 100 usually works together with a computer host 200 so that the computer host 200 can write data into or read data from the flash memory storage system 100. In the present embodiment, the flash memory storage system 100 is a solid state drive (SSD). However, in another embodiment of the present invention, the flash memory storage system 100 may also be a memory card or a flash drive.

The flash memory storage system 100 includes a connector 110, a flash memory 120, and a flash memory controller (also referred to as a flash memory control circuit) 130.

The connector 110 is coupled to the flash memory controller 130 and used to connect the computer host 200 through a bus 300. In the present exemplary embodiment, the connector 110 is a serial advanced technology attachment (SATA) connector. However, the present invention is not limited thereto, and the connector 110 may also be a universal serial bus (USB) connector, an Institute of Electrical and Electronic Engineers (IEEE) 1394 connector, a peripheral component interconnect (PCI) express connector, a memory sick (MS) connector, a multi media card (MMC) connector, a secure digital (SD) connector, a compact flash (CF) connector, an integrated device electronics (IDE) connector, or other suitable connectors.

The flash memory 120 is coupled to the flash memory controller 130 and includes a plurality of physical blocks 120-0~120-N, wherein the physical blocks 120-0~120-N are used for storing data under the control of the flash memory controller 130. In the present exemplary embodiment, the flash memory 120 is a multi level cell (MLC) NAND flash memory. However, the present invention is not limited thereto, and in another exemplary embodiment of the present invention, a single level cell (SLC) NAND flash memory may also be applied to the present invention.

In the flash memory 120, each physical block is the smallest unit for erasing data. Namely, each physical block has the least number of memory cells which are erased together. Each physical block is usually divided into a plurality of (for example, 128) pages. Since in the present exemplary embodiment, the flash memory 120 is a MLC NAND flash memory, each page is the smallest unit for programming data. In other words, each page is the smallest unit for writing or reading data. However, according to the designs of some other flash memories (for example, a SLC NAND flash memory), the smallest programming unit may also be a sector (i.e., each sector is served as the smallest unit for programming data). In another exemplary embodiment of the present invention, the physical blocks in the flash memory 120 are grouped into several zones. By managing the physical blocks in unit of zones, the parallelism of the operations is improved and the management of these physical blocks is simplified.

Figure 2A:
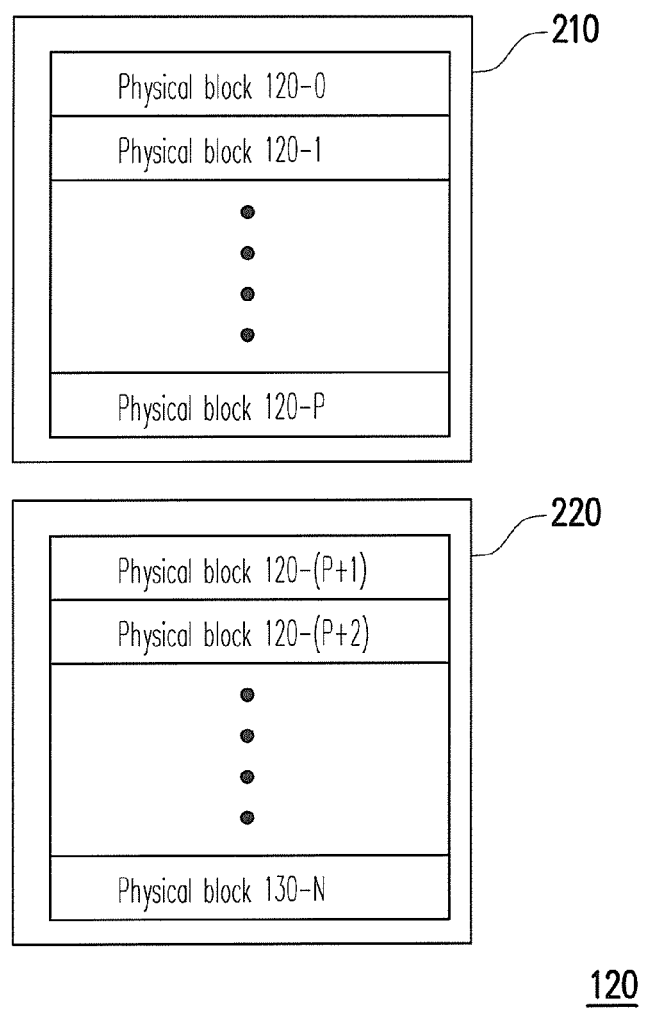
FIGS. 2A~2C illustrate the operations of a flash memory according to an exemplary embodiment of the present invention.
Figure 2B:
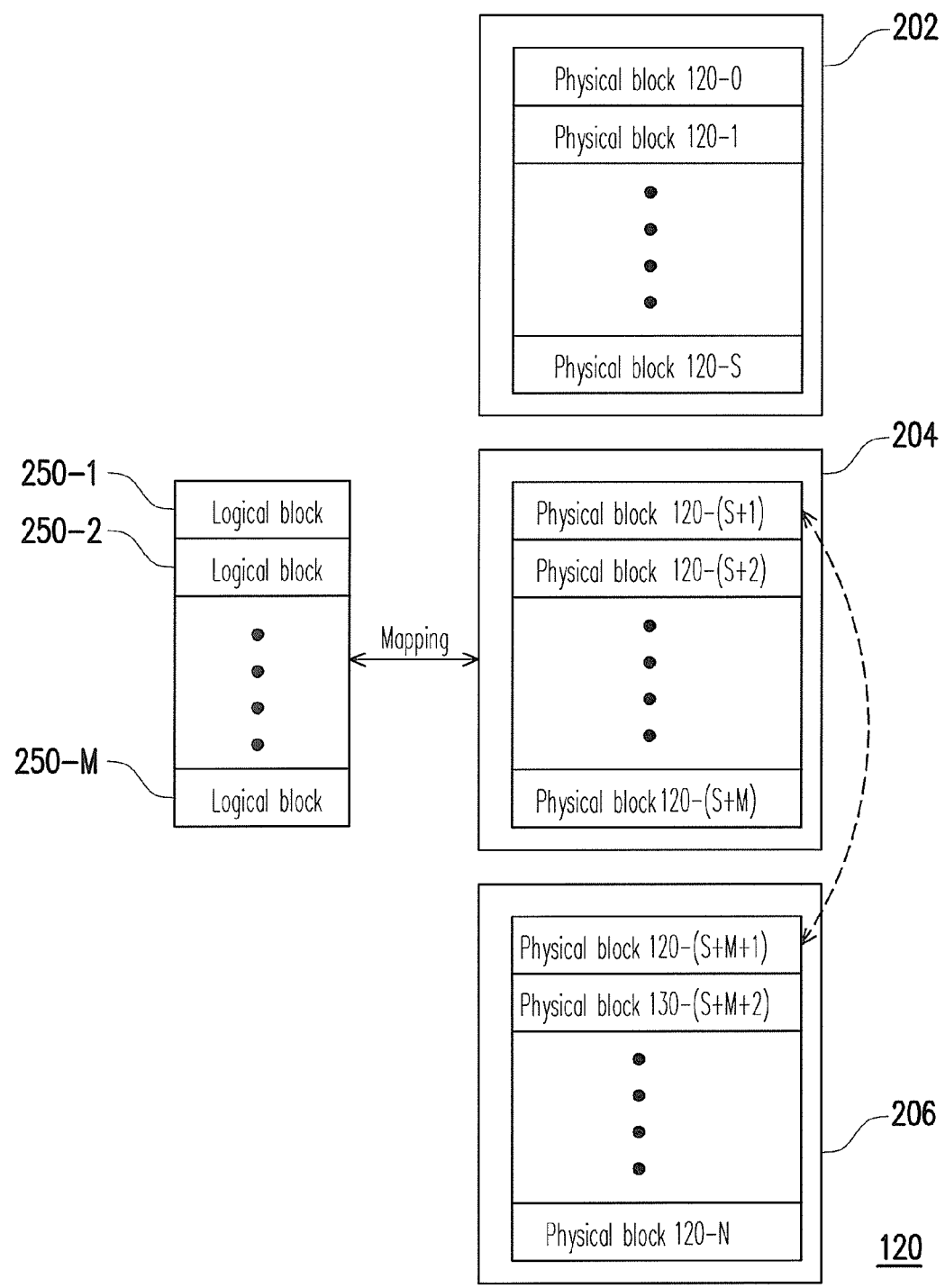
Figure 2C:
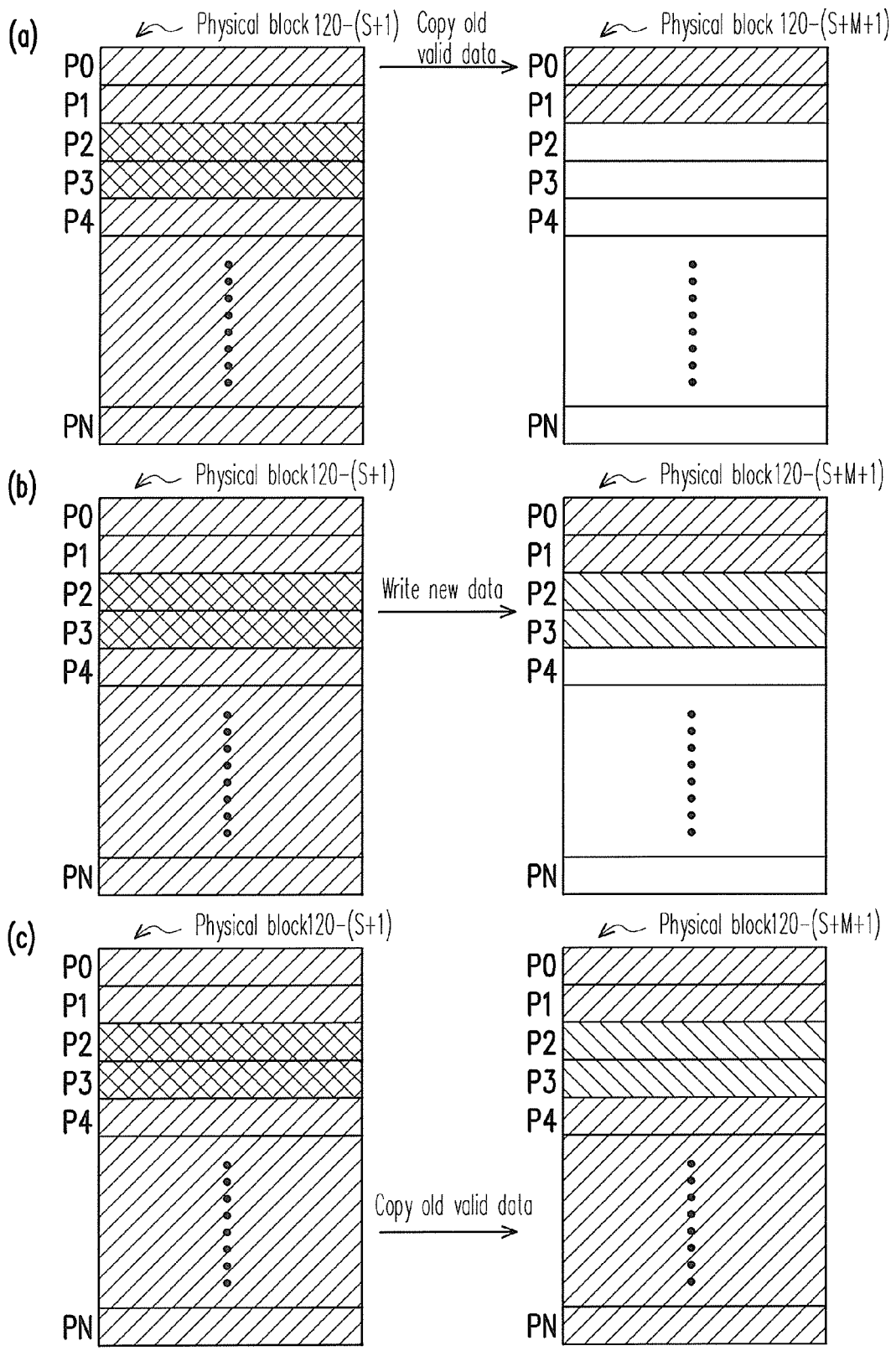

FIGS. 2A~2C illustrate the operations of a flash memory according to an exemplary embodiment of the present invention.

It should be understood that the terms like "select", "move", "replace", "substitute", "alternate", and "group" used herein for describing the operations performed to the physical blocks in the flash memory 120 only refer to logical operations performed thereto. Namely, the actual positions of the physical blocks in the flash memory 120 are not changed. It should be mentioned that the operations described below are carried out by the flash memory controller 130.

Referring to FIG. 2A, the memory management unit 110b logically groups the physical blocks 120-0~120-N of the flash memory 120 into a storage area 210 and a replacement area 220.

The physical blocks 120-0~120-P in the storage area 210 are physical blocks that are normally used in the flash memory storage system 100. Namely, the memory management unit 110b writes data into the physical blocks in the storage area 210.

The physical blocks 120-(P+1)~120-(N) in the replacement area 220 are substitution physical blocks. For example, when the flash memory 120 is manufactured, 4% of its physical blocks are reserved for substitution purpose. Namely, when a physical block in the storage area 210 is damaged, a physical block in the replacement area 220 is used for replacing the damaged physical block (i.e., bad block). Accordingly, if there are still available physical blocks in the replacement area 220, when a physical block is damaged, the memory management unit 110b selects an available physical block from the replacement area 220 for replacing the damaged physical block. If there is no more available physical block in the replacement area 220, when a physical block is damaged, the flash memory storage system 100 is announced invalid.

Referring to FIG. 2B, the flash memory controller 130 logically groups the physical blocks in the storage area 210 into a system area 202, a data area 204, and a spare area 206.

The system area 202 includes physical blocks 120-(0)~120-(S), the data area 204 includes physical blocks 120-(S+1)~120-(S+M), and the spare area 206 includes physical blocks 120-(S+M+1)~120-(P). In the present embodiment, S, M, and P are positive integers not greater than N, and which respectively represent the number of physical blocks disposed in each of these areas and the values can be determined according to the capacity of the flash memory adopted by the manufacturer of the flash memory storage device.

The physical blocks logically belonging to the system area 202 are used to record system data, wherein the system data includes the manufacturer and the model of the flash memory chip, the number of zones in each flash memory, the number of physical blocks in each zone, and the number of pages in each physical block, etc.

The physical blocks logically belonging to the data area 204 are used to store user data. Generally speaking, these physical blocks are the physical blocks mapped to the logical blocks that are accessed by the computer host 200. Namely, the physical blocks in the data area 204 are used to store valid data.

The physical blocks logically belonging to the spare area 206 are used to alternate with the physical blocks in the data area 204. Thus, the physical blocks in the spare area 206 are either blank or available (i.e., no data is recorded therein or data recorded therein is marked as invalid data). Namely, the physical blocks in the data area 204 and the spare area 206 are alternatively used to store data written by the computer host 200 into the flash memory storage system 100.

As described above, the physical blocks of the flash memory 120 are alternatively used by the computer host 200 for storing data. Thus, logical blocks 250-1~250-M are provided to the computer host 200 for accessing data, and the mapping relationship between the physical blocks and the logical blocks is recorded in a logical address-physical address mapping table.

Referring to both FIG. 2B and FIG. 2C, for example, when the computer host 200 is about to write data into the logical block 250-1, the flash memory controller 130 obtains that the logical block 250-1 is currently mapped to the physical block 120-(S+1) in the data area 204 according to the logical address-physical address mapping table. Thus, the memory management unit 110b updates the data in the physical block 120-(S+1). Meanwhile, the flash memory controller 130 selects the physical block 120-(S+M+1) from the spare area 206 for substituting the physical block 120-(S+1) in the data area 204. However, when the memory management unit 110b writes the new data into the physical block 120-(S+M+1), it does not move all the valid data in the physical block 120-(S+1) instantly to the physical block 120-(S+M+1) to erase the physical block 120-(S+1). To be specific, the flash memory controller 130 copies the valid data (i.e., the pages P0 and P1) before the page for writing the new data in the physical block 120-(S+1) to the physical block 120-(S+M+1) (as shown in FIG. 2C(a)) and writes the new data (i.e., the pages P2 and P3 in the physical block 120-(S+M+1)) into the physical block 120-(S+M+1) (as shown in FIG. 2C(b)). By now the flash memory controller 130 finishes the data writing action. Because the valid data in the physical block 120-(S+1) may become invalid during the next operation (for example, a write command), instantly moving all the valid data in the physical block 120-(S+1) to the substitution physical block 120-(S+M+1) may become meaningless. In the present example, the integrated content of the physical block 120-(S+1) and the physical block 120-(S+M+1) is the content of the corresponding logical block 250-1. The number of physical blocks in such a mother-child temporary relationship (i.e., the physical block 120-(S+1) and the physical block 120-(S+M+1)) is determined according to the size of a buffer memory (not shown) in the flash memory controller 130, and the action for temporarily maintaining such a mother-child relationship is referred to as opening mother-child blocks.

Subsequently, the flash memory controller 130 only combines the physical block 120-(S+1) and the physical block 120-(S+M+1) into a single physical block when the contents of the two physical blocks are to be actually integrated, so that the efficiency of using the physical blocks can be improved. Such an action for combining the physical blocks is referred to as closing mother-child blocks. For example, as shown in FIG. 2C(c), while closing the mother-child blocks, the flash memory controller 130 copies the remaining valid data (i.e., the pages P4~PN) in the physical block 120-(S+1) to the substitution physical block 120-(S+M+1), then erases the physical block 120-(S+1) and links it to the spare area 206. Meanwhile, the flash memory controller 130 links the physical block 120-(S+M+1) to the data area 204 and updates the logical address-physical address mapping table to map the logical block 250-1 to the physical block 120-(S+M+1). By now, the action of closing the mother-child blocks is completed.

Figure 3:
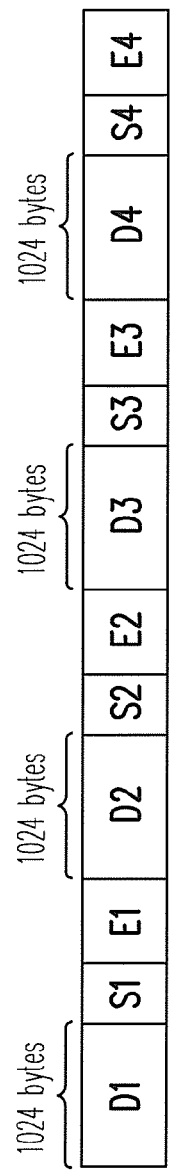
FIG. 3 illustrates the pages in a physical block according to an exemplary embodiment of the present invention.

It should be mentioned that in the present exemplary embodiment, each page includes a plurality of data bit areas, a plurality of redundancy bit areas, and a plurality of error correcting bit areas. FIG. 3 illustrates the pages in a physical block according to the present exemplary embodiment.

Referring to FIG. 3, in the present exemplary embodiment, the flash memory controller 130 divides each page into 4 data bit areas (i.e., the data bit areas D1, D2, D3, and D4), 4 redundancy bit areas (i.e., the redundancy bit areas S1, S2, S3, and S4), and 4 error correcting bit areas (i.e., the error correcting bit areas E1, E2, E3, and E4). The data bit areas D1, D2, D3, and D4 respectively store 2 sector data, the redundancy bit areas S1, S2, S3, and S4 respectively store system data (for example, the quality marks of the physical blocks) corresponding to the data bit areas D1, D2, D3, or D4, and the error correcting bit areas E1, E2, E3, and E4 respectively store the error correcting code corresponding to all the data stored in the corresponding data bit areas D1, D2, D3, or D4. In other words, in the exemplary embodiment, the error correcting code stored in error correcting bit area E1 is used to correct data stored in the data bit area D1, and so on. Thus, in the present exemplary embodiment, each page has a capacity of 8 sectors. Generally speaking, in correspondence with the access unit of the computer host 200, each sector has 512 bytes, and accordingly each page has a capacity of 4 kilo bytes (KB).

The flash memory controller 130 executes a plurality of logic gates or machine instructions implemented in a hardware or firmware form, so as to cooperate with the connector 110 and the flash memory 120 to carry our various data operations. In particular, the flash memory controller 130 identifies whether the data read from the flash memory 120 is accurate.

The-flash memory controller 130 includes a microprocessor unit 152, a first interface unit 154, a second interface unit 156, an error correcting unit 158, a memory management unit 160, a marking unit 162, and an identification unit 164.

The microprocessor unit 152 controls the operation of the entire flash memory controller 130. Namely, the operations of the components in the flash memory controller 130 are directly or indirectly controlled by the microprocessor unit 152.

The first interface unit 154 is coupled to the microprocessor unit 152, and which includes a first interface controller unit 154a and a first interface physical layer unit 154b coupled to the first interface controller unit 154a. The first interface physical layer unit 154b is used to couple to the flash memory 120, and the first interface controller unit 154a processes the data to be transmitted to the flash memory 120 or identifies data received from the flash memory 120. Namely, data to be written into the flash memory 120 is converted by the first interface unit 154 into a format acceptable to the flash memory 120.

The second interface unit 156 is coupled to the microprocessor unit 152, and which includes a second interface controller unit 156a and a second interface physical layer unit 156b coupled to the second interface controller unit 156a. The second interface physical layer unit 156b is used for coupling to the connector 110 to connect the computer host 200, and the second interface controller unit 156a processes data to be transmitted to the computer host 200 or received from the computer host 200. Namely, instructions or data transmitted by the computer host 200 are transmitted to the microprocessor unit 152 through the second interface unit 156. In the present exemplary embodiment, the second interface unit 156 conforms to the SATA interface standard in correspondence with the connector 110. However, the present invention is not limited thereto, and the second interface unit 156 may also conform to the USB interface standard, the IEEE 1394 interface standard, the PCI express interface standard, the MS interface standard, the MMC interface standard, the SD interface standard, the CF interface standard, the IDE interface standard, or other suitable data transmission interface standards in correspondence with the connector 110.

The error correcting unit 158 is coupled to the microprocessor unit 152 and executes an error correcting process. To be specific, when the computer host 200 is about to write data into the flash memory storage system 100, the error correcting unit 158 generates an error correcting code corresponding to the data and stores the error correcting code into the flash memory 120 together with the data. Subsequently, when the computer host 200 is about to read the data from the flash memory storage system 100, the error correcting unit 158 corrects the data according to the corresponding error correcting code to ensure the accuracy of the data. For example, if 2 sector data is stored in the data bit area D1 (as shown in FIG. 3), the error correcting unit 158 generates an error correcting code according to the 2 sector data and stores the error correcting code into the error correcting bit area E1. The operation pattern of the error correcting unit 158 is well known to those skilled in the art therefore will not be described herein.

The memory management unit 160 is coupled to the microprocessor unit 152 and used to operate and manage the flash memory 120. To be specific, the memory management unit 160 maintains a logical address-physical address mapping table for the flash memory 120 and accesses data in the flash memory 120 to be accessed by the computer host 200 according to the logical address-physical address mapping table. For example, the memory management unit 160 executes the operations illustrated in FIGS. 2A~2C and divides each page in the physical blocks 120-0~120-N of the flash memory 120 into data bit areas, redundancy bit areas, and error correcting bit areas (as shown in FIG. 3).

The marking unit 162 is coupled to the microprocessor unit 152, and records data accuracy marks in the flash memory 120 for indicating whether the data stored in the flash memory 120 is accurate. Particularly, in the present exemplary embodiment, the marking unit 162 records a data accuracy mark for each sector data stored by the computer host 200. For example, if 2 sector data is stored into the data bit area D1 (as shown in FIG. 3), the marking unit 162 records 2 data accuracy marks respectively corresponding to the 2 sector data with 2 bits in the redundancy bit area S1. If the sector data is accurate, the corresponding data accuracy marks are '0' to indicate a normal status of the sector data, and if the sector data is not accurate, the corresponding data accuracy marks are '1' to indicate an error status of the sector data.

Generally speaking, when the computer host 200 transmits sector data to the flash memory storage system 100 and the memory management unit 160 successfully writes the sector data into the data bit area of a page, the marking unit 162 records all the data accuracy marks in a redundancy bit area corresponding to the data bit area as the normal status.

In addition, when the memory management unit 160 executes the operations as illustrated in FIG. 2C(a) and FIG. 2C(c) to move sector data between the pages (i.e., copy the old valid data in the page P0 of the physical block 120-(S+1) to the page P0 of the physical block 120-(S+M+1)), the error correcting unit 158 executes the error correcting process according to the data read from the page P0 of the physical block 120-(S+1) and the corresponding error correcting code. Then, the error correcting unit 158 generates a new error correcting code according to the corrected data and writes the corrected data and the new error correcting code into the page P0 of the physical block 120-(S+M+1). In the present example, if it is found during the error correcting process that the valid old data copied from the page P0 of the physical block 120-(S+1) contains error bits that cannot be corrected, because the copied data cannot be restored, the data written into the page P0 of the physical block 120-(S+M+1) is considered containing uncorrectable error bits. Besides, because the error correcting unit 158 generates a new error correcting code for the data containing uncorrectable error bits and stores the new error correcting code into the page P0 of the physical block 120-(S+M+1), the error correcting unit 158 cannot identify the data as data containing uncorrectable error bits according to the new error correcting code. In the present example, the marking unit 162 records all the data accuracy marks in the redundancy bit areas of the page P0 of the physical block 120-(S+M+1) as the error status.

Referring to FIG. 1 again, the identification unit 164 is coupled to the microprocessor unit 152. When the computer host 200 is about to read data from the flash memory storage system 100, the identification unit 164 determines whether the data contains any error bit (i.e. whether the data is accurate) according to the error correction result of the error correcting unit 158 and the information (i.e., the data accuracy marks) recorded by the marking unit 162. For example, when the data contains error bits, the marking unit 162 sends an error message to the computer host 200 to notify it that the data is not accurate.

For example, as described above, if uncorrectable error bits are found in the valid old data copied from the page P0 of the physical block 120-(S+1) to the page P0 of the physical block 120-(S+M+1), when the computer host 200 reads the data from the page P0 of the physical block 120-(S+M+1), even though the error correcting unit 158 executes the error correcting process to the data containing the error bits according to the new error correcting code and accordingly determines the data as an accurate data, the identification unit 164 determines that the data is not accurate according to the data accuracy marks recorded in the redundancy bit areas of the page P0 of the physical block 120-(S+M+1).

Namely, in the flash memory storage system 100, when the computer host 200 is about to read sector data from a data bit area of the flash memory 120, the memory management unit 160 transmits all the data in the data bit area and the corresponding error correcting code to the error correcting unit 158 to execute the error correcting process, and the identification unit 164 determines the status of the data according to the error correction result and the data accuracy marks corresponding to the sector data, wherein the identification unit 164 determines the sector data to be accurate only when both the error correction result and the data accuracy marks indicate that the sector data is accurate.

It should be mentioned that the computer host 200 always stores several backups of important data. Accordingly, the computer host 200 can restore a damaged data by using the backup data (for example, by rewriting the data stored in a sector with the backup data). Thus, if the computer host 200 receives an error message from the identification unit 164 so that it gets to know that the data is inaccurate and restore the data, the marking unit 162 records the data accuracy mark corresponding to the sector data as the normal status.

Figure 4:
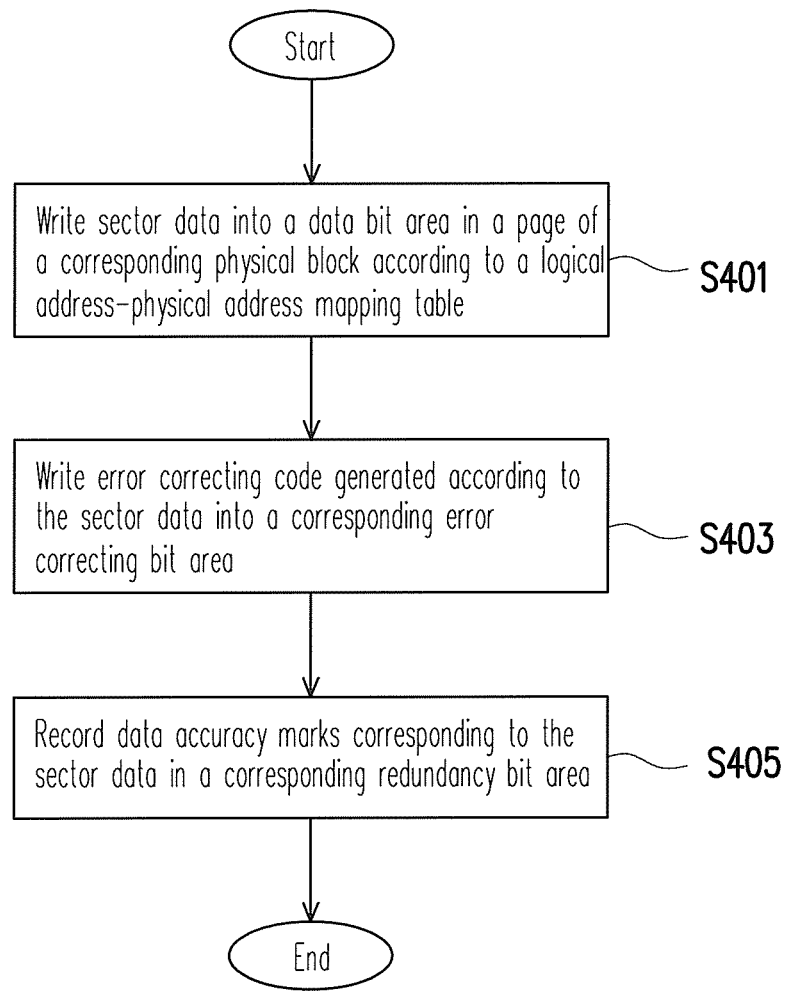
FIG. 4 is a flowchart of writing sector data according to an exemplary embodiment of the present invention.
Figure 5:
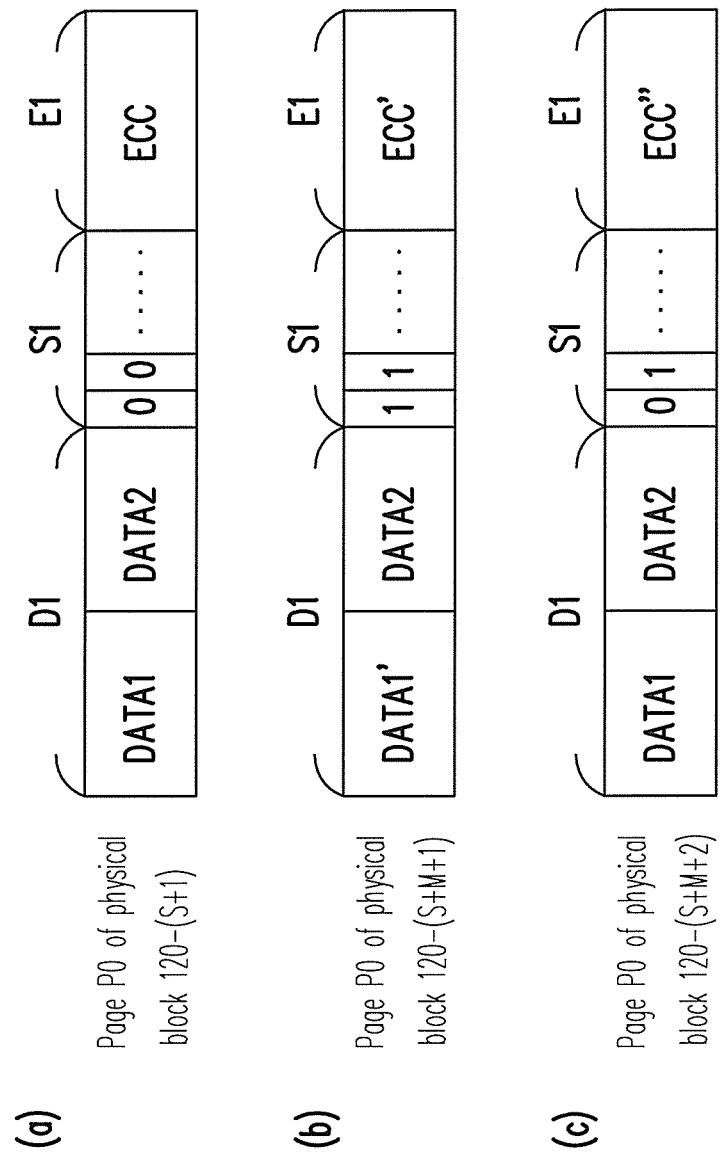
FIG. 5 illustrates an example of writing sector data according to an exemplary embodiment of the present invention.

FIG. 4 is a flowchart of writing sector data according to an exemplary embodiment of the present invention, and FIG. 5 illustrates an example of writing sector data according to the present exemplary embodiment, wherein data is written into the physical block 120-(S+1) and copied from the physical block 120-(S+1) to the physical block 120-(S+M+1) and uncorrectable error bits are found.

Referring to FIG. 4 and FIG. 5, in step S401, the memory management unit 160 writes the sector data into the data bit area in the page of the corresponding physical block according to the logical address-physical address mapping table (for example, as shown in FIG. 5(a), the sector data DATA1 and DATA2 is written into the data bit area D1 of the page P0 in the physical block 120-(S+1)). After that, in step 403, the error correcting code generated according to the sector data is written into the corresponding error correcting bit area (for example, as shown in FIG. 5(a), the error correcting code ECC is written into the error correcting bit area E1 of the page P0 in the physical block 120-(S+1)). Next, in step S405, data accuracy marks corresponding to the sector data is recorded into the corresponding redundancy bit area (for example, as shown in FIG. 5(a), 2 data accuracy marks corresponding to the sector data DATA1 and DATA2 are written into the redundancy bit area S1 of the page P0 in the physical block 120-(S+1)).

When the sector data is from the computer host 200 or not form the flash memory storage system 100, when the data is successfully written, the data accuracy marks in the corresponding redundancy bit area are recorded as a normal status (as shown in FIG. 5(a)).

In addition, when the sector data is from other pages (i.e., data is copied between physical blocks), the data accuracy marks are recorded according to the error correction result obtained by executing the error correcting process to the sector data, wherein when the error correction result shows that the sector data contains an error bit that cannot be corrected, the data accuracy marks in the redundancy bit area are recorded as an error status (as shown in FIG. 5(b)).

Moreover, when the computer host 200 restores specific sector data, the data accuracy mark corresponding to the specific sector data is recorded as the normal status (as shown in FIG. 5(c)). It should be mentioned that in the present example, because the sector data in the page P0 of the physical block 120-(S+M+1) is updated, the data in the physical block 120-(S+M+1) is moved to a blank physical block (for example, the physical block 120-(S+M+2)) selected from the spare area 206.

It should be mentioned that as described above, even though the memory management unit 160, the marking unit 162, and the identification unit 164 are implemented in the flash memory controller 130 in a hardware form, the present invention is not limited thereto. In another exemplary embodiment, the memory management unit 160, the marking unit 162, and the identification unit 164 are implemented in the flash memory controller 130 in a firmware form. For example, a plurality of programs for accomplishing the functions of the memory management unit 160, the marking unit 162, and the identification unit 164 is recorded into a program memory (for example, a read only memory (ROM)), and the program memory is embedded into the flash memory controller 130. When the flash memory storage system 100 is in operation, the programs are executed by the microprocessor unit 152 to accomplish the error data identification mechanism according to embodiments of the present invention.

In another embodiment of the present invention, the programs for accomplishing the functions of the memory management unit 160, the marking unit 162, and the identification unit 164 may also be stored in a specific area (for example, the system area in a flash memory exclusively used for storing system data) of the flash memory 120 in a software form. Similarly, these programs are executed by the microprocessor unit 152 when the flash memory storage system 100 is in operation.

Figure 6:
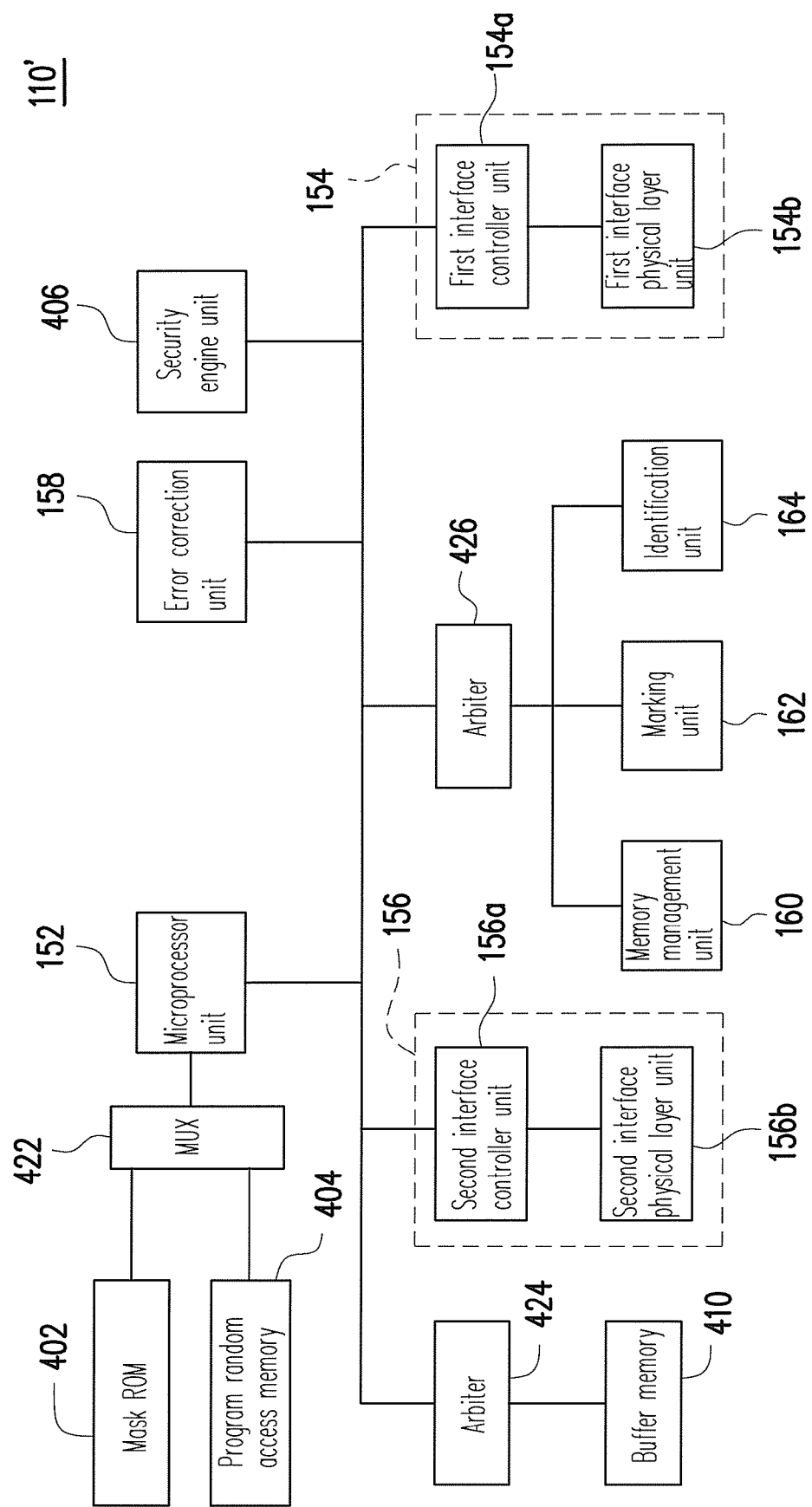
FIG. 6 is a block diagram of a flash memory controller according to another exemplary embodiment of the present invention.

In yet another exemplary embodiment of the present invention, the flash memory controller 130 may also includes other circuit units. FIG. 6 is a block diagram of a flash memory controller according to another exemplary embodiment of the present invention.

Referring to FIG. 6, besides the microprocessor unit 152, the first interface unit 154, the second interface unit 156, the memory management unit 160, the marking unit 162, and the identification unit 164 described above, the flash memory controller 130' further includes a mask ROM 402, a program random access memory 404, a security engine unit 406, and a buffer memory 410. The mask ROM 402 and the program random access memory 404 are coupled to the microprocessor unit 152 through a multiplexer (MUX) 422, the buffer memory 410 is coupled to the microprocessor unit 152 through an arbiter 424, and the memory management unit 160, the marking unit 162, and the identification unit 164 are coupled to the microprocessor unit 152 through an arbiter 426.

The mask ROM 402 is used to store information or program codes for the flash memory controller 130. In particular, the information or program codes are not updatable. The program random access memory 404 is used to temporarily store firmware codes currently executed by the microprocessor unit 152. To be specific, since random access memory has very fast operation speed, the operation efficiency of the flash memory controller 130 is improved by loading the firmware codes executed by the microprocessor unit 152 into a random access memory in advance. For example, if the memory management unit 160, the marking unit 162, and the identification unit 164 are implemented in a software or firmware form, when the flash memory storage system 100 is initialized, the programs for accomplishing the functions of foregoing units are loaded into the random access memory and then executed by the microprocessor unit 152.

The security engine unit 406 is coupled to the microprocessor unit 152 and used to encrypt/decrypt data written into the flash memory 120, so as to ensure the security of the data. In the present exemplary embodiment, the encryption/decryption technique adopted by the security engine unit 406 is the advanced encryption standard (AES). However, the present invention is not limited thereto, and the data encryption standard (DES) or other encryption/decryption techniques may also be applied to the present invention.

The buffer memory 410 is used to temporarily store data to be written into or read from the flash memory 120 by the computer host 200. The buffer memory 410 is a dynamic random access memory (DRAM). However, the present invention is not limited thereto, and a magnetoresistive random access memory (MRAM), a phase change random access memory (PCRAM), a single level cell (SLC) NAND flash memory, or other suitable memories may also be applied to the present invention.

Based on the structure described above, the flash memory storage system 100 in the present exemplary embodiment can effectively identify error data in the flash memory through double verifications of error correcting codes and the data accuracy marks.

Figure 7:
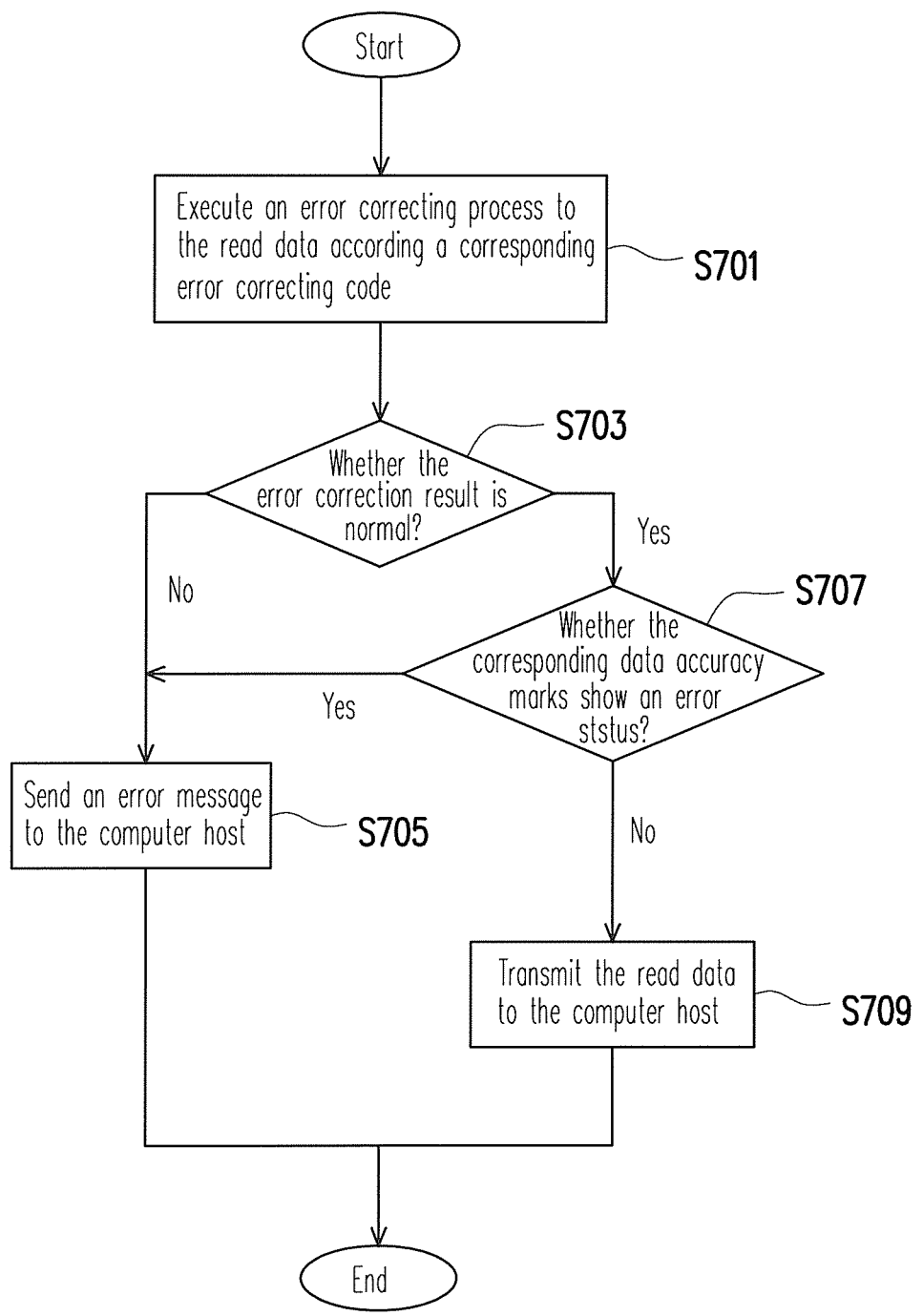
FIG. 7 is a flowchart of a method for identifying error data in a flash memory according to an exemplary embodiment of the present invention.

FIG. 7 is a flowchart of a method for identifying error data in a flash memory according to an exemplary embodiment of the present invention.

Referring to FIG. 7, when the memory management unit 160 reads data according to an instruction of the computer host 200, in step S701, an error correcting process is executed to the read data according to an error correcting code corresponding to the read data. Then, in step S703, whether the error correction result is normal is determined. When the error correction result is not normal (i.e., the data contains an error bit that cannot be corrected), in step S705, an error message is sent to the computer host 200.

When the error correction result is normal, in step S707, whether the corresponding data accuracy mark shows the error status is determined. When the corresponding data accuracy mark shows the error status, step S705 is executed. If the corresponding data accuracy mark shows the normal status, in step S709, the read data is transmitted to the computer host 200.

It should be mentioned that in the present exemplary embodiment, each data bit area stores 2 sector data. However, the present invention is not limited thereto, and in another exemplary embodiment of the present invention, each data bit area may store one or more than 2 sector data. If each data bit area stores one sector data, the corresponding redundancy bit area only records one data accuracy mark. In yet another exemplary embodiment of the present invention, each page may be disposed with only one data bit area and one corresponding redundancy bit area, or each page may also be configured with only one redundancy bit area corresponding to a plurality of data bit areas. In the present example, all the data accuracy marks in the page are stored in this redundancy bit area. Moreover, in still another exemplary embodiment of the present invention wherein each page has a plurality of redundancy bit areas, all the data accuracy marks in the page may also be stored in one of the redundancy bit areas.

As described above, in the present invention, the accuracy of data is determined through double verifications of error correcting codes and data accuracy marks, so that the data read by a computer host from a flash memory storage system can be ensured as accurate. In addition, because the data accuracy marks are disposed corresponding to the access unit of the computer host, when the computer host restores an error data, the flash memory storage system can correctly identify the restored data. Therefore, the previously described exemplary embodiments of the present invention have many advantages, including the accuracy of data is determined and the restored data is correctly identified, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory control circuit, comprising:
a microprocessor unit;
a first interface unit, coupled to the microprocessor unit, and used to connect a flash memory, wherein the flash memory has a plurality of physical blocks, and each of the physical blocks has a plurality of pages;
a second interface unit, coupled to the microprocessor unit, and used to connect a computer host;
an error correcting unit, coupled to the microprocessor unit;
a memory management unit, coupled to the microprocessor unit, and used to divide each of the pages into at least one data bit area, and at least one redundancy bit area and at least one error correcting bit area corresponding to the data bit area, wherein the data bit area has a plurality of sectors to store a plurality of sector data; and
a marking unit, coupled to the microprocessor unit,
wherein when the computer host writes a plurality of sector data into one of the data bit areas, the error correcting unit generates an error correcting code according to the sector data, the memory management unit writes the sector data into one of the data bit areas and the error correcting code into the corresponding error correcting bit area, and the marking unit records the data accuracy marks as a normal status in the corresponding redundancy bit area, wherein each of the data accuracy marks is corresponding to one of the sector data,
wherein when the memory management unit copies the sector data stored in one of the data bit areas to another one of the data bit areas, the error correcting unit determines whether the sector data cannot be corrected according to the error correcting code in the corresponding error correcting bit area,
wherein when the sector data cannot be corrected, the marking unit records the data accuracy marks in the corresponding redundancy bit area as an error status.

2. The flash memory control circuit according to claim 1 further comprising an identification unit coupled to the microprocessor unit,
wherein when the computer host reads the sector data from the flash memory, the error correcting unit corrects the sector data according to the error correcting code corresponding to the sector data, and the identification unit identifies whether the sector data is accurate according to a error correction result and the data accuracy marks corresponding to the sector data.

3. The flash memory control circuit according to claim 2, wherein when the sector data is not accurate, the identification unit sends an error message to the computer host.

4. The flash memory control circuit according to claim 3, wherein when the computer host receives the error message and restores at least one of the sector data, the marking unit records the data accuracy mark corresponding to the restored sector data as the normal status.

5. A flash memory storage system, comprising:
a connector, used to connect a computer host;
a flash memory, having a plurality of physical blocks, wherein each of the physical blocks has a plurality of pages; and
a flash memory controller, coupled to the connector and the flash memory, and used to divide each of the pages into at least one data bit area, and at least one redundancy bit area and at least one error correcting bit area corresponding to the data bit area, wherein the data bit area has a plurality of sectors for storing a plurality of sector data, wherein when the computer host writes a plurality of sector data into one of the data bit areas, the flash memory controller generates an error correcting code according to the sector data, writes the sector data into one of the data bit areas, writes the error correcting code into the corresponding error correcting bit area, and records the data accuracy marks in the corresponding redundancy bit area as a normal status, wherein each of the data accuracy marks is corresponding to one of the sector data, wherein when the flash memory controller copies the sector data stored in one of the data bit areas to another one of the data bit areas, the flash memory controller determines whether the sector data cannot be corrected according to the error correcting code in the corresponding error correcting bit area, wherein when the sector data cannot be corrected, the flash memory controller records the data accuracy marks in the corresponding redundancy bit area as an error status.

6. The flash memory storage system according to claim 5, wherein when the computer host reads the sector data from the flash memory, the flash memory controller corrects the sector data according to the error correcting code corresponding to the sector data and identifies whether the sector data is accurate according to a error correction result and the data accuracy marks corresponding to the sector data.

7. The flash memory storage system according to claim 6, wherein when the sector data is not accurate, the flash memory controller sends an error message to the computer host.

8. The flash memory storage system according to claim 7, wherein when the computer host receives the error message and restores at least one of the sector data, the marking unit records the data accuracy mark corresponding to the restored sector data as the normal status.

9. A method for identifying error data in a flash memory, wherein the flash memory has a plurality of physical blocks, and each of the physical blocks has a plurality of pages, the method comprising:
dividing each of the pages into at least one data bit area, and at least one redundancy bit area and at least one error correcting bit area corresponding to the data bit area, wherein the data bit area has a plurality of sectors;
configuring a plurality of data accuracy marks in each of the redundancy bit areas by using a marking unit;
when a computer host writes a plurality of sector data into one of the data bit areas, writing an error correcting code corresponding to the sector data in the corresponding error correcting bit area, and recording the data accuracy marks in the corresponding redundancy bit area as a normal status by using the marking unit, wherein each of the data accuracy marks is corresponding to one of the sector data;
when the sector data stored in one of the data bit areas is copied to another one of the data bit areas, determining whether the sector data cannot be corrected according to the error correcting code in the corresponding error correcting bit area; and
when the sector data cannot be corrected, recording the data accuracy marks in the corresponding redundancy bit area as an error status.

10. The method according to claim 9, further comprising when the computer host reads the sector data from the flash memory, identifying whether the sector data is accurate according to the error correcting code and the data accuracy marks corresponding to the sector data by using an identification unit.

11. The method according to claim 10, further comprising sending an error message to the computer host when the sector data is not accurate.

12. The method according to claim 11, further comprising when the computer host receives the error message and restores at least one of the sector data, recording the data accuracy mark corresponding to the restored sector data as the normal status.

13. A method for identifying error data in a flash memory, wherein the flash memory has a plurality of physical blocks, and each of the physical blocks has a plurality of pages, the method comprising:
dividing each of the pages into at least one data bit area, and at least one redundancy bit area and at least one error correcting bit area corresponding to the data bit area, wherein the data bit area has a sector;
configuring a data accuracy mark in each of the redundancy bit areas by using a marking unit;
when a computer host writes a sector data into one of the data bit areas, writing an error correcting code corresponding to the sector data into the corresponding error correcting bit area, and recording the data accuracy mark in the corresponding redundancy bit area as a normal status by using the marking unit;
when the sector data stored in one of the data bit areas is copied to another one of the data bit areas, determining whether the sector data cannot be corrected according to the error correcting code in the corresponding error correcting bit area; and
when the sector data cannot be corrected, recording the data accuracy marks in the corresponding redundancy bit area as an error status.

14. The method according to claim 13, further comprising when the computer host reads the sector data from the flash memory, identifying whether the sector data is accurate according to the error correcting code and the data accuracy mark corresponding to the sector data by using an identification unit.

15. The method according to claim 14, further comprising sending an error message to the computer host when the sector data is not accurate.

16. The method according to claim 15, further comprising when the computer host receives the error message and restores the sector data, recording the data accuracy mark corresponding to the restored sector data as the normal status.

17. A flash memory storage system, comprising:
a connector, used to connect a computer host;
a flash memory, having a plurality of physical blocks, wherein each of the physical blocks has a plurality of pages; and
a flash memory controller, coupled to the connector and the flash memory, and used to divide each of the pages into at least one data bit area, and at least one redundancy bit area and at least one error correcting bit area,
wherein if the computer host writes sector data into the data bit area of a first page among the pages, the flash memory controller generates an error correcting code according to the sector data, writes the sector data into the data bit area, writes the error correcting code into the error correcting bit area of the first page, and records a data accuracy mark in the redundancy bit area of the first page as a normal status,
wherein if the flash memory controller reads the sector data stored in the data bit area of the first page, the flash memory controller determines whether the sector data stored in the data bit area of the first page cannot be corrected according to the error correcting code in the corresponding error correcting bit area, wherein if the sector data stored in the data bit area of the first page cannot be corrected, the flash memory controller writes the sector data stored in the data bit area of the first page among the pages into the data bit area of a second page among the pages and records the data accuracy mark in the redundancy bit area of the second page as an error status.

18. The flash memory storage system according to claim 17, wherein when the computer host reads the sector data from the flash memory, the flash memory controller corrects the sector data according to the error correcting code corresponding to the sector data and identifies whether the sector data is accurate according to an error correction result and the data accuracy mark corresponding to the sector data.

19. The flash memory storage system according to claim 18, wherein when the sector data is not accurate, the flash memory controller sends an error message to the computer host.

20. The flash memory storage system according to claim 19, wherein when the computer host receives the error message and restores the sector data, the marking unit records the data accuracy mark corresponding to the restored sector data as the normal status.

21. A method for identifying error data in a flash memory, wherein the flash memory has a plurality of physical blocks, and each of the physical blocks has a plurality of pages, the method comprising:

dividing each of the pages into at least one data bit area, and at least one redundancy bit area and at least one error correcting bit area;

configuring a data accuracy mark in the redundancy bit area;

if a computer host writes sector data into the data bit area of a first page among the pages, writing an error correcting code corresponding to the sector data in the error correcting bit area of the first page, and recording the data accuracy mark in the redundancy bit area of the first page as a normal status;

if the sector data stored in the data bit area of the first page is read, determining whether the sector data stored in the data bit area of the first page cannot be corrected according to the error correcting code in the corresponding error correcting bit area; and if the sector data stored in the data bit area of the first page cannot be corrected, writing the sector data stored in the data bit area of the first page into the data bit area of a second page among the pages and recording the data accuracy mark in the redundancy bit area of the second page as an error status.

22. The method according to claim 21, further comprising if the computer host reads the sector data from the flash memory, identifying whether the sector data is accurate according to the error correcting code and the data accuracy mark corresponding to the sector data by using an identification unit.

23. The method according to claim 22, further comprising sending an error message to the computer host when the sector data is not accurate.

24. The method according to claim 23, further comprising if the computer host receives the error message and restores the sector data, recording the data accuracy mark corresponding to the restored sector data as the normal status.

* * * * *